(12) United States Patent
Dadashev et al.

(10) Patent No.: US 6,456,557 B1
(45) Date of Patent: Sep. 24, 2002

(54) VOLTAGE REGULATOR FOR MEMORY DEVICE

(75) Inventors: Oleg Dadashev, Hadera; Kyra Jacob, Raanana, both of (IL)

(73) Assignee: Tower Semiconductor LTD, Migdal Heamek (IL)

( * ) Notice: Subject to any disclaimer, the term of this patent is extended or adjusted under 35 U.S.C. 154(b) by 0 days.

(21) Appl. No.: 09/941,451

(22) Filed: Aug. 28, 2001

(51) Int. Cl.[7] .................................................. G11C 7/00
(52) U.S. Cl. .............. 365/226; 365/185.18; 365/185.09
(58) Field of Search ........................... 365/226, 185.18, 365/189.09, 189.11

(56) References Cited

U.S. PATENT DOCUMENTS

| | | | |
|---|---|---|---|
| 5,296,801 A | * 3/1994 | Ohtsuka et al. | 365/189.09 |
| 5,768,192 A | 6/1998 | Eitan | |
| 5,995,412 A | * 11/1999 | Ohta | 365/185.03 |
| 6,081,456 A | 6/2000 | Dadashev | |
| 6,195,297 B1 | * 2/2001 | Sano | 365/185.25 |

OTHER PUBLICATIONS

Patent application entitled: Methods for Fabricating A Semiconductor Chip Having CMOS Devices And A Fieldless Array; Ser. No. 09/244,316, Efraim Aloni et al.

* cited by examiner

Primary Examiner—Son Mai

(57) ABSTRACT

A memory device includes a voltage regulator that compensates for resistance variations in the bit line control (multiplexing) circuit used to access the memory cells by including in its feedback path an emulated multiplexing circuit having an identical resistance to that of the multiplexing circuit. The voltage regulator also includes a differential amplifier, a pull-up transistor for generating a reference voltage, and a first clamp transistor controlled by the reference voltage to pass a desired voltage level to the multiplexing circuit. The feedback path incorporates the emulator circuit between a second clamp transistor and a voltage divider. Because the emulation and multiplexing circuits have the same resistance, the voltage passed to the voltage divider is essentially identical to the voltage passed by the multiplexing circuit to a selected memory cell, thereby allowing the voltage regulator to produce an optimal voltage level at the selected memory cell.

20 Claims, 9 Drawing Sheets

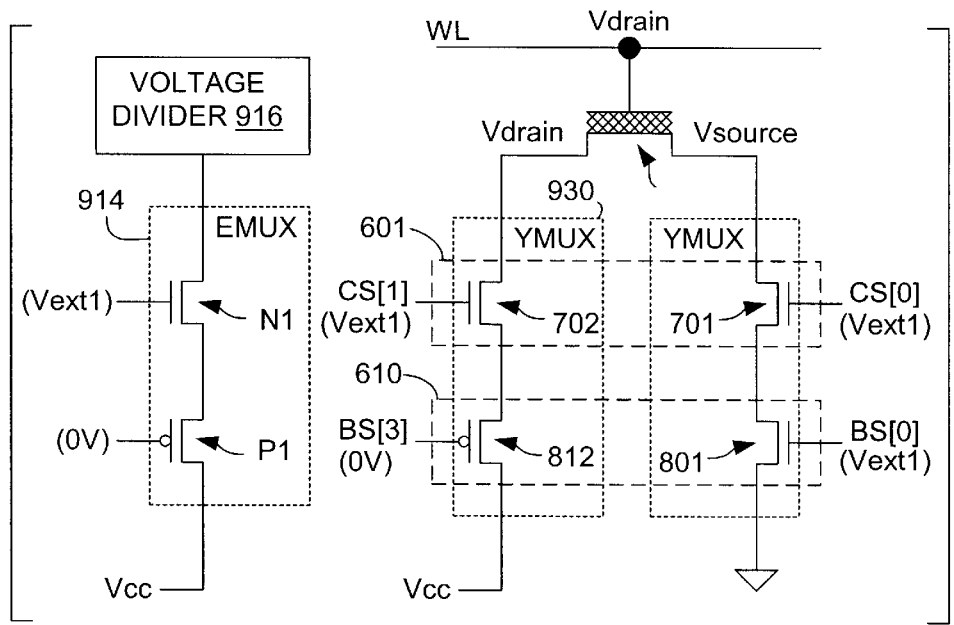
FIG. 10
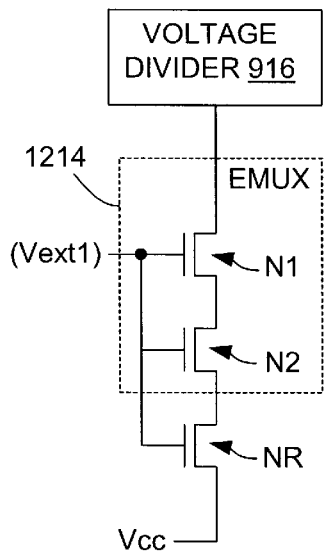
FIG. 12
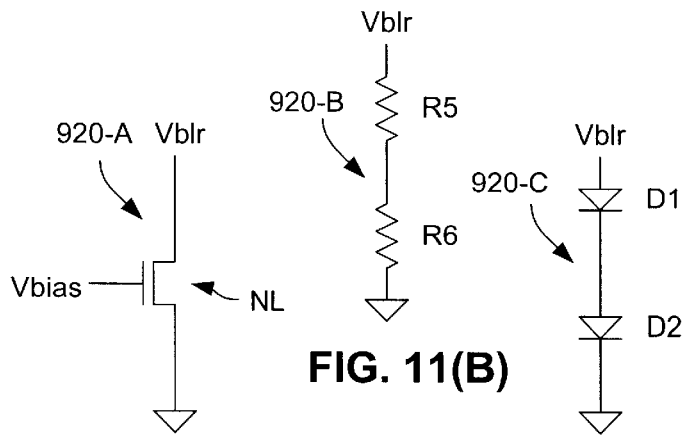
FIG. 11(A)  FIG. 11(B)  FIG. 11(C)

VOLTAGE REGULATOR FOR MEMORY DEVICE

FIELD OF THE INVENTION

The present invention relates to integrated circuit (IC) devices, and in particular relates to voltage regulators for IC devices, such as non-volatile memory arrays, that require constant voltage levels over a wide range of processing and operating conditions.

BACKGROUND OF THE INVENTION

FIG. 1 is a simplified schematic diagram showing a portion of a conventional memory device 100 that includes an array 110 of non-volatile memory cells 112 (one shown), a bit line control circuit 120, and a conventional voltage regulator 130. Other portions of conventional memory device 100 are omitted for brevity.

According to well-established techniques, the memory cells of array 110 are arranged in rows and columns, and each memory cell 112 is accessed during read, program, or erase operations by applying appropriate voltages to associated word and bit lines. For example, as indicated in FIG. 1, the gate terminal of each memory cell 112 is connected to an associated word line WL, and the drain and source terminals of memory cell 112 are connected to associated bit lines BL1 and BL2. Each memory cell of array 110 is addressed using a word line control circuit (not shown) and a bit line control circuit 120 that includes multiplexing circuits (YMUXes) 122 and 124. Specifically, YMUX 122 includes a series of pass transistors (not shown) that are controlled (turned on and off) by a first set of control signals to connect bit line BL1 to an appropriate voltage source. Similarly, YMUX 122 includes pass transistors that are controlled to connect bit line BL2 to ground during a read operation or to a sense amplifier.

During the operational lifetime of each nonvolatile memory cell 112, it is important that drain voltage Vdrain and gate voltage Vgate be constant over all temperature, system power supply (Vdd) and fabrication process variations (referred to herein as "variable conditions"). Variations of Vdrain produce threshold voltage (Vt) margin loss, which is the difference between the threshold voltage of a programmed cell versus the threshold voltage of an erased cell. When Vt margin loss occurs, the possibility of operational error increases.

Conventional voltage regulator 130 is provided in an attempt to maintain a constant Vdrain during read operations over the variable conditions. Voltage regulator 130 includes an operational amplifier 132, a PMOS pull-up transistor 134, a clamp transistor 136, and a voltage divider 138. Operational amplifier 132, PMOS transistor 134, and voltage divider 138 are connected to generate a reference voltage Vblr that controls the gate voltage of clamp transistor 136 in response to a band gap reference voltage Vbgref, which by definition is constant over the variable conditions and is applied to the inverting input terminal of operational amplifier 132. The output terminal of operation amplifier 132 is applied to the gate terminal of PMOS transistor 134, which has a first terminal connected to a first voltage source Vext1, thereby causing PMOS transistor 134 to generate reference voltage Vblr. Reference voltage Vblr is passed from the second (lower) terminal of PMOS transistor 134 to the gate terminal of clamp transistor 136 and to voltage divider 138. Voltage divider 138 includes a first resistor R1 connected between the second terminal of PMOS transistor 134 and the non-inverting input terminal of operational amplifier 132, and a second resistor R2 that is connected between resistor R1 and ground. Resistors R1 and R2 are selected to satisfy the equation: Vblr=Vbgref*(1+R2/R1). Accordingly, because band gap reference voltage Vbgref is constant over the variable conditions, reference voltage Vblr is also constant over the variable conditions. Clamp transistor 136, which is controlled by reference voltage Vblr, is connected between a second voltage source Vext2 and YMUX 122. Reference voltage Vblr clamps the source voltage of clamp transistor 136, and passes a reduced voltage (i.e., Vblr−Vgs) through YMUX 122 to the drain of memory cell 112.

A problem with voltage regulator 130 is that it does not account for resistance variations of pass transistors (not shown) utilized in YMUX 122 that are applied to the drain of memory cell 112. That is, regardless of the stability of reference voltage Vblr, the resistance of these pass transistors changes in response to variable operating conditions (e.g., temperature) and processing parameters, thereby resulting in potential Vt margin loss because the drain voltage Vdrain applied to memory cell 112 varies widely over the operational lifetime of memory device 100.

What is needed is voltage regulator for a memory array that compensates for the resistance variations generated in the multiplexing circuit used to access the memory cells of a memory array such that optimal voltage conditions are applied to the memory cells over all process, temperature, and voltage supply variations.

SUMMARY OF THE INVENTION

The present invention is directed to a memory device including a voltage regulator that compensates for resistance variations in the bit line control (multiplexing) circuit used to access the memory cells, thereby providing optimal voltage supply conditions during read operations over all variable conditions. This compensation is achieved by including in the feedback path of the voltage regulator an emulated multiplexing circuit having an identical resistance to that of the multiplexing circuit (or a multiple thereof). This emulated multiplexing circuit is fabricated using the same processing parameters as the multiplexing circuit, and includes the number of series-connected pass transistors that are utilized in the multiplexing circuit to access the memory cells, thereby causing the emulated multiplexing circuit to have an essentially identical resistance to that of the multiplexing circuit over all variable conditions. Accordingly, variations in the resistance of the multiplexing circuit caused by fabrication process variations, system voltage variations, or temperature variations are mirrored in emulated multiplexing circuit, thereby avoiding the Vt margin loss problems associated with conventional voltage regulators.

In accordance with a disclosed embodiment, a voltage regulator of the present invention is incorporated into a memory device including an array of 2-bit non-volatile memory cells. Each 2-bit memory cell has a first charge trapping region for storing a first bit that is read by applying a read voltage to a first terminal and connected the second terminal to ground, and a second charge trapping region for storing a second bit that is read by applying the read voltage to the second terminal and connecting the first terminal to ground. To facilitate this two-way access of each memory cell, a bit line control circuit includes a multi-level multiplexing circuit that selectively passes the read current in either direction through the memory cell. However, such 2-bit memory cells require a very precise drain voltage during read operations that cannot be too great (so as to inadvertently program the non-read bit) or too small (so that the non-read bit influences the read operation). Therefore, even relatively small changes in the variable conditions under which the multiplexing circuit are fabricated and/or operated can cause erroneous read operations. Accordingly, problems associated with the multiplexing circuit used to access 2-bit memory cells are particularly relevant to the present invention. However, the present invention may also be beneficially utilized in memory devices having single-bit memory cells, and also in any other IC devices requiring reliable voltage conditions at nodes accessed through multi-stage accessing circuits.

In the disclosed embodiment, the voltage regulator includes a differential (operational) amplifier, a pull-up transistor, and a feedback path (circuit) including an emulated multiplexing circuit having a resistance that is equal to that of the multiplexing circuit utilized to access a memory cell of the IC device. A first (e.g., inverting) input terminal of the differential amplifier is connected to receive a reference voltage (e.g., a band gap reference voltage), a second (e.g., non-inverting) input terminal of the differential amplifier is connected to receive a sample voltage from the feedback path, and an output terminal of the differential amplifier is connected to the gate terminal of the pull-up transistor. The pull-up transistor is connected between a first voltage source, and generates a reference voltage that controls a first clamp transistor connected between a second voltage supply and the multiplexing circuit. As mentioned above, the multiplexing circuit passes a read voltage from the first clamp transistor to the drain of a selected memory cell through a series of turned-on pass transistors. The reference voltage is also applied to a second clamp transistor of the feedback path, which also includes the emulated multiplexing circuit and a voltage divider. In accordance with an aspect of the present invention, the second clamp transistor is essentially identical to the first pass transistor (i.e., has the same size and is fabricated during the same process steps), and is connected between the second voltage source and the emulated multiplexing circuit. As mentioned above, the emulated multiplexing circuit includes a series of turned-on pass transistors that are essentially identical to the pass transistors of the multiplexing circuit (i.e., same number, same size, and fabricated during the same process steps). Therefore, the voltage passed through the emulated multiplexing circuit to the voltage divider is equal to the drain voltage passed through the multiplexing circuit to the memory cell. The voltage divider samples this emulated drain voltage, and passes the sampling to a second (e.g., non-inverting) terminal of the differential amplifier. In accordance with another aspect of the present invention, the voltage divider includes a first resistor R3 and a second resistor R4 the satisfy the equation: Vdemul=Vbgref*(1+R4/R3), where Vdemul is the emulated drain voltage, and Vbgref is the band gap reference voltage applied to the first input terminal of the differential amplifier. With the voltage divider constructed to satisfy this equation, the voltage divider of the present invention provides a constant drain voltage to the memory cells of the IC device over all variable conditions.

In accordance with yet another aspect of the present invention, the pull-up transistor is a PMOS transistor, and the voltage regulator includes a leaker circuit connected between the second terminal of the PMOS transistor and ground. The leaker circuit draws a constant current, and is provided to assure that the PMOS transistor remains in saturation. Further, the leaker circuit aids in the elimination of overshoots during stabilization of the reference voltage.

BRIEF DESCRIPTION OF THE DRAWINGS

These and other features, aspects and advantages of the present invention will become better understood with regard to the following description, appended claims, and accompanying drawings, where:

FIG. 10 is a schematic diagram showing an emulated multiplexing circuit of the voltage regulator of FIG. 9;

FIGS. 11(A), 11(B), and 11(C) are schematic diagrams showing various leaker circuits utilized in the voltage regulator of FIG. 9; and FIG. 12 is a schematic diagram showing an emulated multiplexing circuit of the voltage regulator of FIG. 9 according to an alternative embodiment of the present invention.

DETAILED DESCRIPTION OF THE DRAWINGS

The voltage regulator of the present invention is described below with reference to a memory device incorporating 2-bit non-volatile memory cells. In particular, the description briefly describes 2-bit non-volatile memory cells, and then describes a memory device including both 2-bit non-volatile memory cells and a voltage regulator according to the present invention. As pointed out below, two bits are read from each 2-bit memory cell in separate read operations by generating currents in two directions through the memory cell, thereby requiring a very precise drain voltage during the read operation. As further described below, a special multiplexing circuit is provided to facilitate this bi-directional read capability, which introduces resistances that change with the variable conditions under which the memory device is fabricated and operated. Accordingly, the voltage regulator of the present invention is particularly useful in memory devices having 2-bit non-volatile memory cells because the voltage regulator mirrors the resistance variations of the multiplexing circuit, thereby providing a precise drain voltage under all variable conditions. However, the novel characteristics of the present invention are not limited to memory devices having 2-bit non-volatile memory cells, and the voltage regulator disclosed herein can be utilized in any IC device requiring reliable voltage conditions at nodes accessed through multi-stage accessing circuits.

Figure 2:
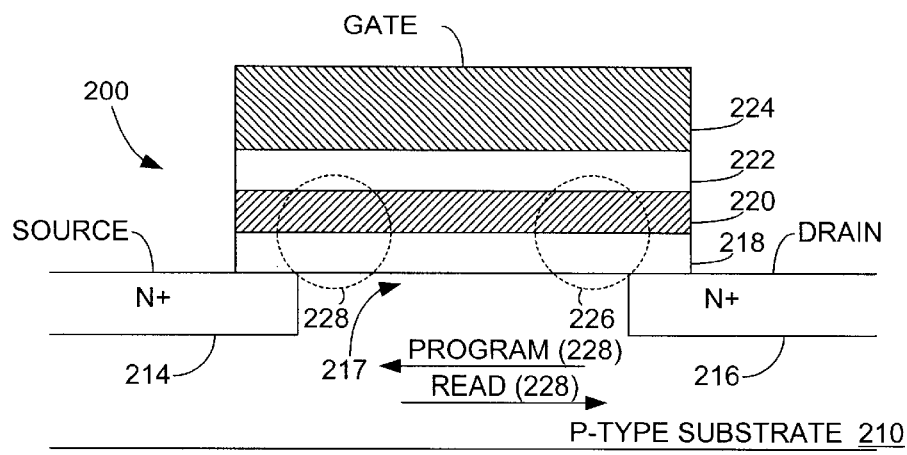
FIG. 2 is a cross sectional diagram illustrating a conventional 2-bit non-volatile memory cell.

FIG. 2 is a cross sectional view of a conventional 2-bit non-volatile semiconductor memory cell 200 that utilizes asymmetrical charge trapping to store two bits of information. 2-bit memory cell 200, which is fabricated in p-type substrate 210, includes n+ source region 214, n+ drain region 216, channel region 217, silicon oxide layer 218, silicon nitride layer 220, silicon oxide layer 222, and control gate 224. Oxide layer 218, nitride layer 220 and oxide layer 222 are collectively referred to as ONO layer 221. Located at opposite ends of nitride layer 220 are a first charge trapping region 226 and a second charge trapping 228. First charge trapping region 226 is programmed by connecting source region 214 to ground, connecting drain region 216 to a programming voltage of about 9 Volts, and connecting control gate 224 to a voltage of about 10 Volts. As a result, electrons are accelerated from source region 214 to drain region 216. Near drain region 216, some electrons gain sufficient energy to pass through oxide layer 218 and be trapped in first charge trapping region 226 of nitride layer 220 in accordance with a phenomenon known as hot electron injection. Because nitride layer 220 is non-conductive, the injected charge remains localized within first charge trapping region 226 in nitride layer 220. First charge trapping region 226 is read by applying 0 Volts to the region 216, 2 Volts to region 214, and 3 volts to the gate electrode. If charge is stored in charge trapping region 226 (i.e., memory cell 200 is programmed), then memory cell does not conduct current under these conditions. If there is no charge stored in charge trapping region 226 (i.e., memory cell 200 is erased), then memory cell 200 conducts current under these conditions. The current, or lack of current, is sensed by a sense amplifier to determine the state of memory cell 200. Second charge trapping region 228 is programmed and read in a manner similar to first charge trapping region 226. More specifically, the second charge trapping region 228 is programmed and read by exchanging the source and drain voltages described above for programming and reading the first charge trapping region 226. Memory cell 200 is described in more detail in U.S. Pat. No. 5,768,192 and U.S. Pat. No. 6,081,456.

Note that the drain voltage Vdrain applied to memory cell 200 during read operations must be more precise than that of conventional single-bit memory cells. If the Vdrain applied to memory cell 200 is greater than 2 Volts during a read operation, the second (non-read) bit can be stressed and, over time, unintentionally programmed. Conversely, if the Vdrain applied to memory cell 200 is less than approximately 1.5V during read, the state of the second bit will influence the bit current of the bit being read, possibly resulting in erroneous data. In contrast to the drain voltage problem of 2-bit memory cell 200, conventional single-bit memory cells do not have such strict limitations on Vdrain because only a single bit is read per cell.

Figure 3:
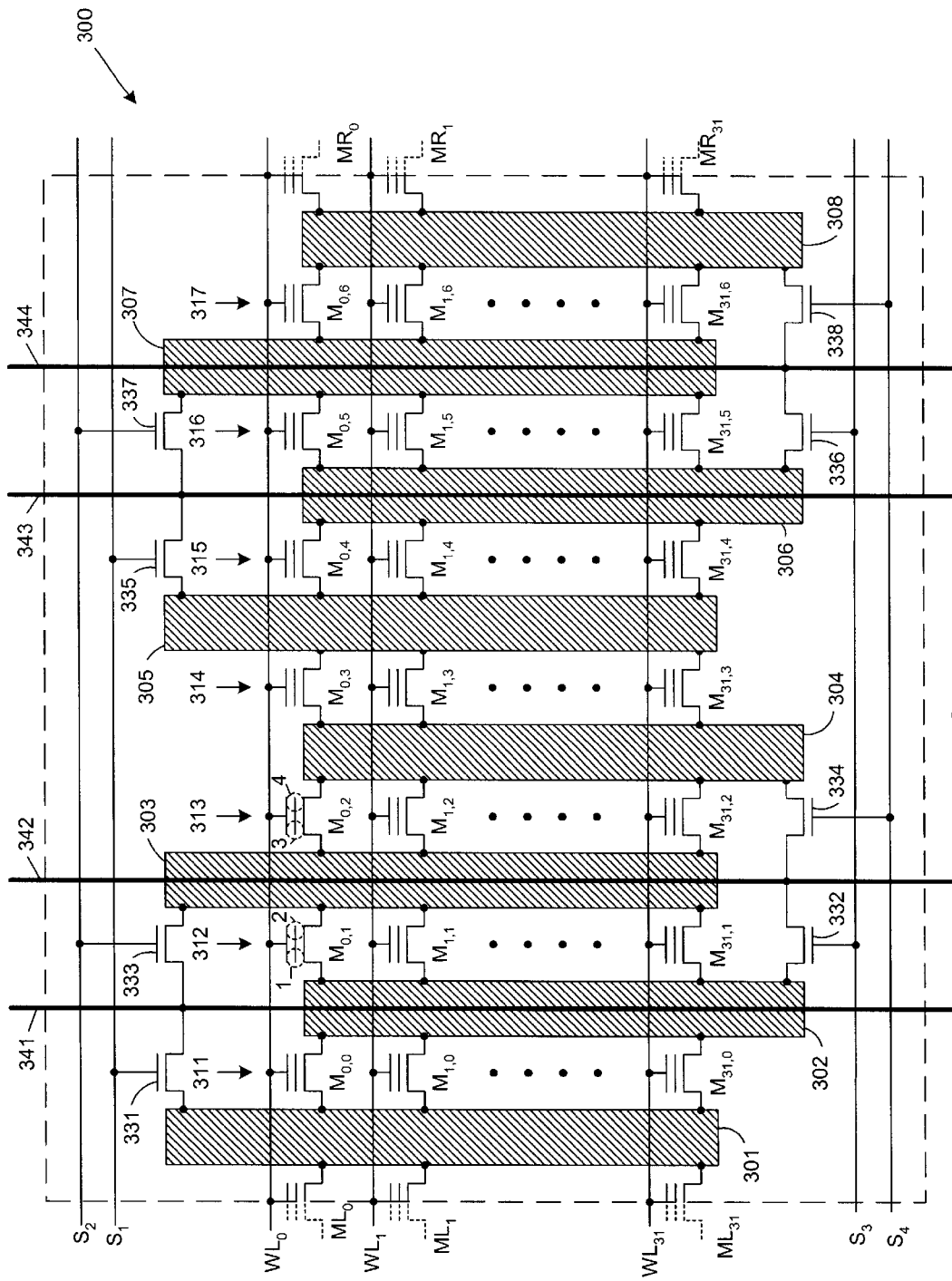
FIG. 3 is a schematic diagram illustrating a memory block that uses the 2-bit memory cells of FIG. 2.

FIG. 3 is a schematic diagram illustrating a memory block 300 that includes a plurality of 2-bit memory cells identical to 2-bit memory cell 200 (FIG. 2). Memory block 300 includes seven full columns of memory cells, two columns of memory cells that are shared with adjacent memory blocks, and thirty-two rows of memory cells. The rows extend along a first axis, and the columns extend along a second axis, perpendicular to the first axis. The memory cells in the seven full columns are identified as memory cells $M_{X,Y}$, where X and Y represent the row and column locations, respectively, of the memory cells within memory block 300. The shared memory cells on the left border of memory block 300 are identified as memory cells $ML_X$, and the shared memory cells on the right border of memory block 300 are identified as memory cells $MR_X$. Each of the memory cells includes two charge trapping regions, namely, a left charge trapping region and a right charge trapping region. The charge trapping regions of memory cell $M_{0,1}$ are labeled as left charge trapping region 1 and right charge trapping region 2. Similarly, the charge trapping regions of memory cell $M_{0,2}$ are labeled as left charge trapping region 3 and right charge trapping region 4. The source and drain regions of memory cells $M_{0,0}$–$M_{31,6}$ are formed by diffused regions 301–308, which extend in parallel along the second axis. As described in more detail below, diffused regions 301–308 also operate as bit lines within memory block 300. Consequently, diffused regions 301–308 are hereinafter referred to as diffusion bit lines. ONO structures 311–317 are located between adjacent diffusion bit lines 301–308. For example, ONO structure 311 is located between diffusion bit lines 301 and 302. The gates of the memory cells in each row are commonly connected to a word line. More specifically, the memory cells of rows 0–31 are connected to word lines $WL_0$–$WL_{31}$, respectively. The fabrication of memory block 300 is described in more detail in commonly owned, co-filed U.S. patent application Ser. No. 09/244,316, entitled "METHODS FOR FABRICATING A SEMICONDUCTOR CHIP HAVING CMOS DEVICES AND A FIELDLESS ARRAY" by Efraim Aloni, which is hereby incorporated by reference.

The 2-bit memory cells of memory block 300 are accessed through high-voltage select transistors 331–338 and metal bit lines 341–344. Metal bit lines 341–344 are located in an interconnect layer that extends over the above-described elements of memory block 300. High-voltage select transistors 331–338 are designed to have gate oxide sufficient to withstand the high voltages required for programming and erasing the memory cells. In general, select transistors 331–338 are controlled to selectively connect metal bit lines 341–344 to diffusion bit lines 301–308. To access the memory cells in memory block 300, two of the select lines $S_1$–$S_4$ are pulled high, thereby turning on the select transistors coupled to these two select lines, and two of the select lines $S_1$–$S_4$ are pulled low, thereby turning off the select transistors coupled to these two select lines. The turned on select transistors couple two columns of memory cells to the metal bit lines 341–344. During read operations, the logic high level of select lines $S_1$–$S_4$ is high enough to pass 1.5–2 Volts to diffusion bit lines 301–308. However, during program and erase operations, the logic high level of select lines $S_1$–$S_4$ is equal to about 10 Volts. Providing this 10 Volt signal to select lines $S_1$–$S_4$ enables the select transistors to transmit relatively high program and erase voltages (e.g., 5.5 Volts and 8 Volts) to the appropriate bit lines.

A plurality of memory blocks, identical to memory block 300, can be coupled together along the first and second axes, thereby forming a larger memory array. Because each memory block has four metal bit lines, a memory array formed by coupling 64 memory blocks identical to memory block 300 along the first axis produces a memory array having 256 metal bit lines. Shared memory cells are formed at the interfaces between memory blocks along the first axis. This memory array can have any number of memory blocks connected along the second axis. In this memory array, an additional diffusion bit line, metal bit line and select transistor must be added to the left side of each of the left-most memory blocks of the array. This enables the shared memory cells $ML_0$–$ML_{31}$ of the left-most memory blocks to be accessed. Similarly, an additional diffusion bit line, metal bit line, and select transistor must be added to the right side of each of the right-most memory blocks of the array, thereby enabling the shared memory cells $MR_0$–$MR_{31}$ of the right-most memory blocks to be accessed.

Figure 4:
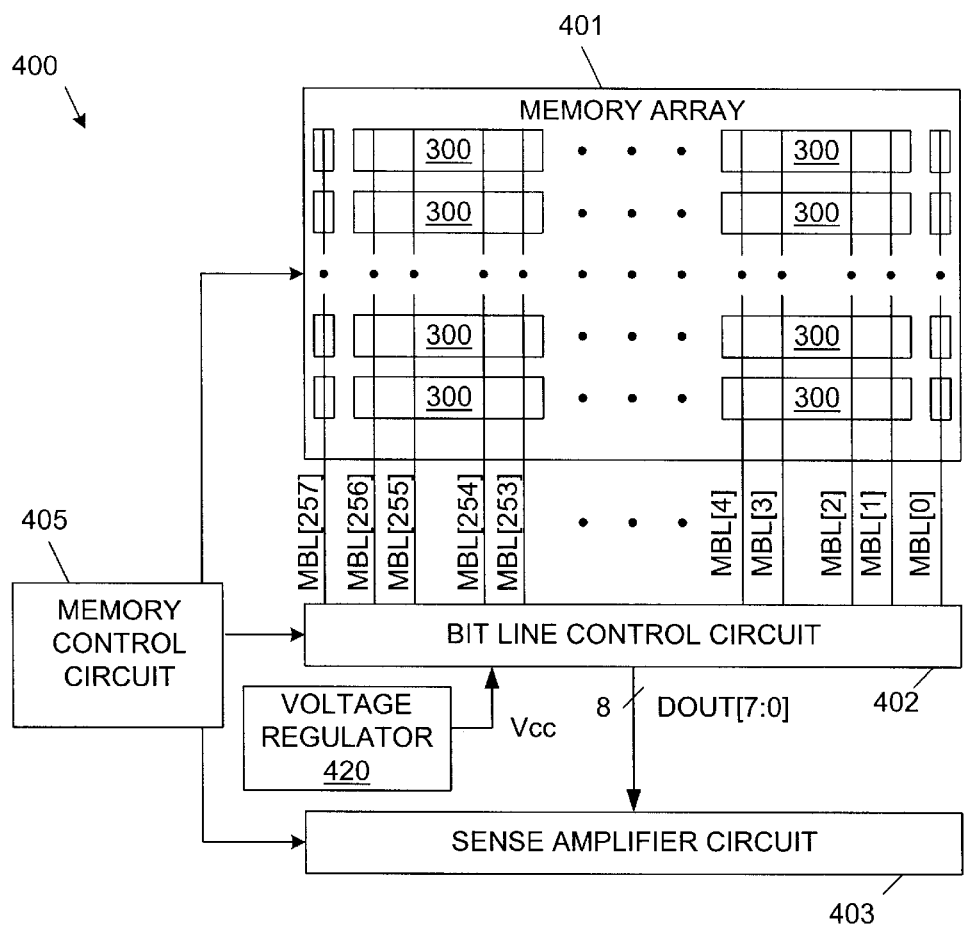
FIG. 4 is a block diagram of a memory device in accordance with one embodiment of the present invention.

FIG. 4 is a block diagram of a memory device 400 that performs read operations in accordance with one embodiment of the invention. Memory device 400 includes memory array 401, bit line control circuit 402, sense amplifier circuit 403, memory control circuit 405, and voltage regulator 420. In the described example, memory array 401 has a width of 64 memory blocks that are connected as described above in connection with FIG. 3. Thus, 258 metal bit lines MBL[257:0] are routed from memory array 401 to bit line control circuit 402. As described in more detail below, bit line control circuit 402 is controlled to apply the appropriate read, program and erase voltages to the metal bit lines MBL[257:0]. In the described embodiment, bit line control circuit 402 provides a read voltage Vcc to the metal lines that is generated by voltage regulator 420. During a read operation, bit line control circuit 402 also routes an addressed set of eight bit lines to sense amplifier circuit 403 in response to a column address received from memory control circuit 405.

Figure 5:
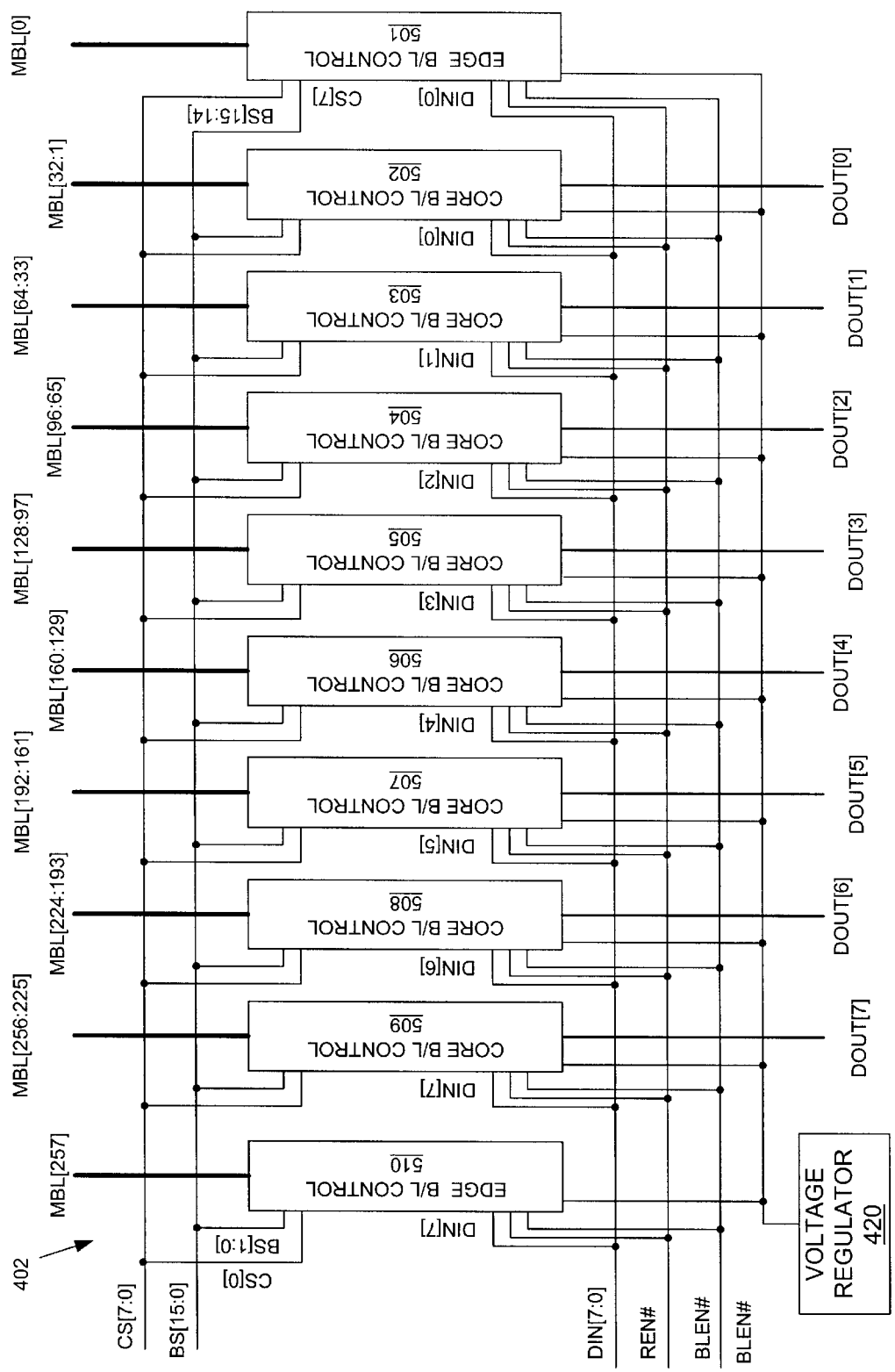
FIG. 5 is a block diagram of a bit line control circuit in accordance with one embodiment of the present invention.

FIG. 5 is a block diagram of bit line control circuit 402 in accordance with the disclosed embodiment. Bit line control circuit 402 includes core bit line control circuits 502–509 and edge bit line control circuits 501 and 510. Each of core bit line control circuits 502–509 is coupled to receive 32 metal bit lines from memory array 401. Each of edge bit line control circuits 501 and 510 is coupled to receive an edge metal bit line from memory array 401. Each of core bit line control circuits 502–509 is further coupled to receive column select signals CS[7:0], bit select signals BS[15:0], read enable signal REN#, and bit line enable signal BLEN# from memory controller 405, and read voltage Vcc from voltage regulator 420. The symbol "#" indicates that the signal is active low. Core bit line control circuits 502–509 are also coupled to receive input data values DIN[0]–DIN[7], respectively, from memory controller 405 during programming and erase operations. Core bit line control circuits 502–509 provide output signals DOUT[0]–DOUT[7], respectively, to sense amplifier circuit 403 during read operations.

Figure 6:
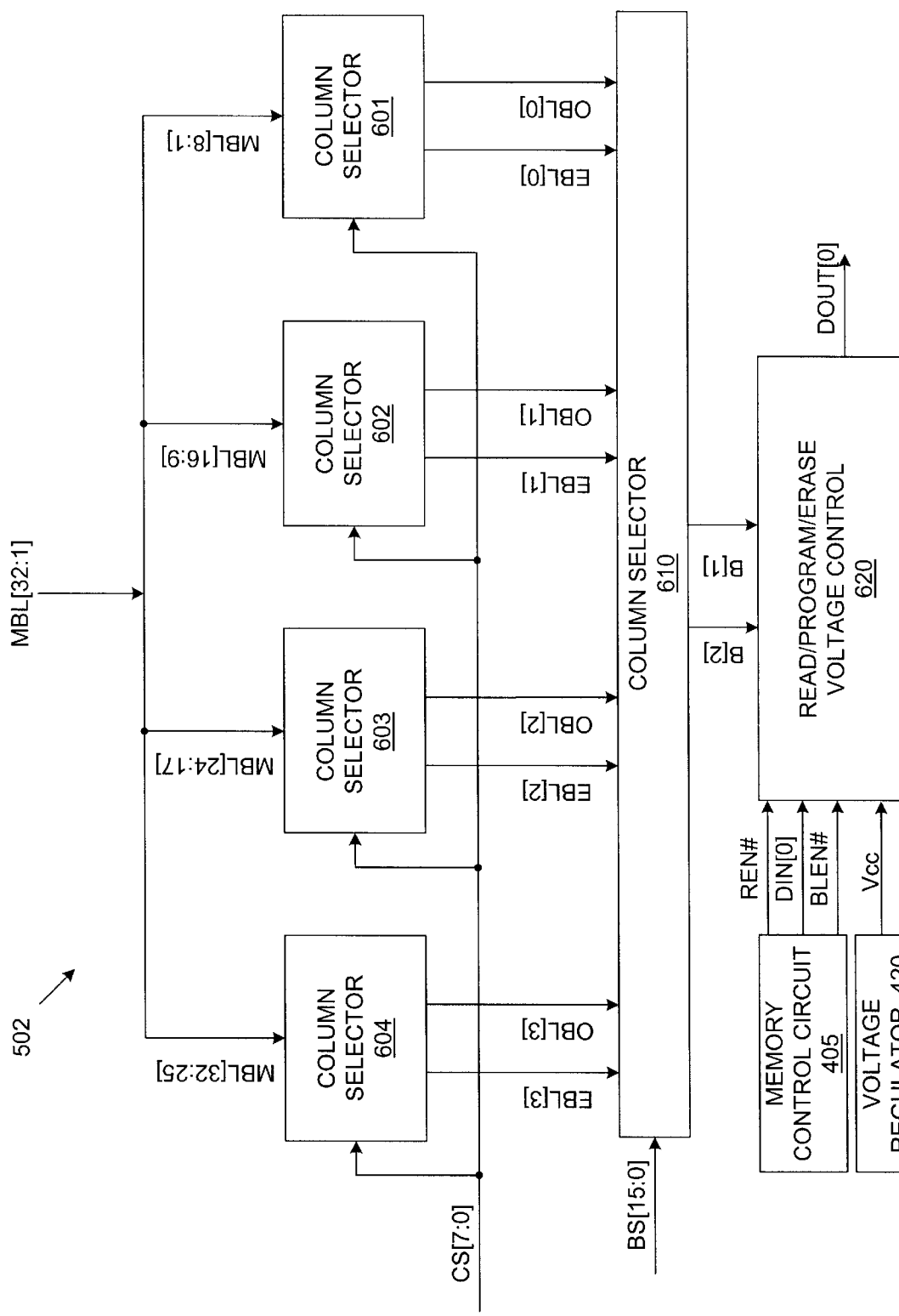
FIG. 6 is a block diagram of a core bit line control circuit located in the bit line control circuit of FIG. 5 in accordance with one embodiment of the present invention.

FIG. 6 is a block diagram of core bit line control circuit 502. Because all of core bit line control circuits 502–509 are identical, only core bit line control circuit 502 is described in detail. Core bit line control circuit 502 includes first-level column selector circuits 601–604 and second-level column selector circuit 610 which form a multiplexing circuit utilized during read operations to access selected memory cells. Each of column selector circuits 601–604 is coupled to receive eight metal bit lines, and couples a pair of the incoming metal bit lines to a pair of outgoing metal bit lines. For example, column selector circuit 601 couples a pair of the incoming metal bit lines MBL[8:1] to outgoing odd metal bit line OBL[0] and outgoing even metal bit line EBL[0]. In general, the notations OBL and EBL represent odd and even bit lines, respectively.

Figure 7:
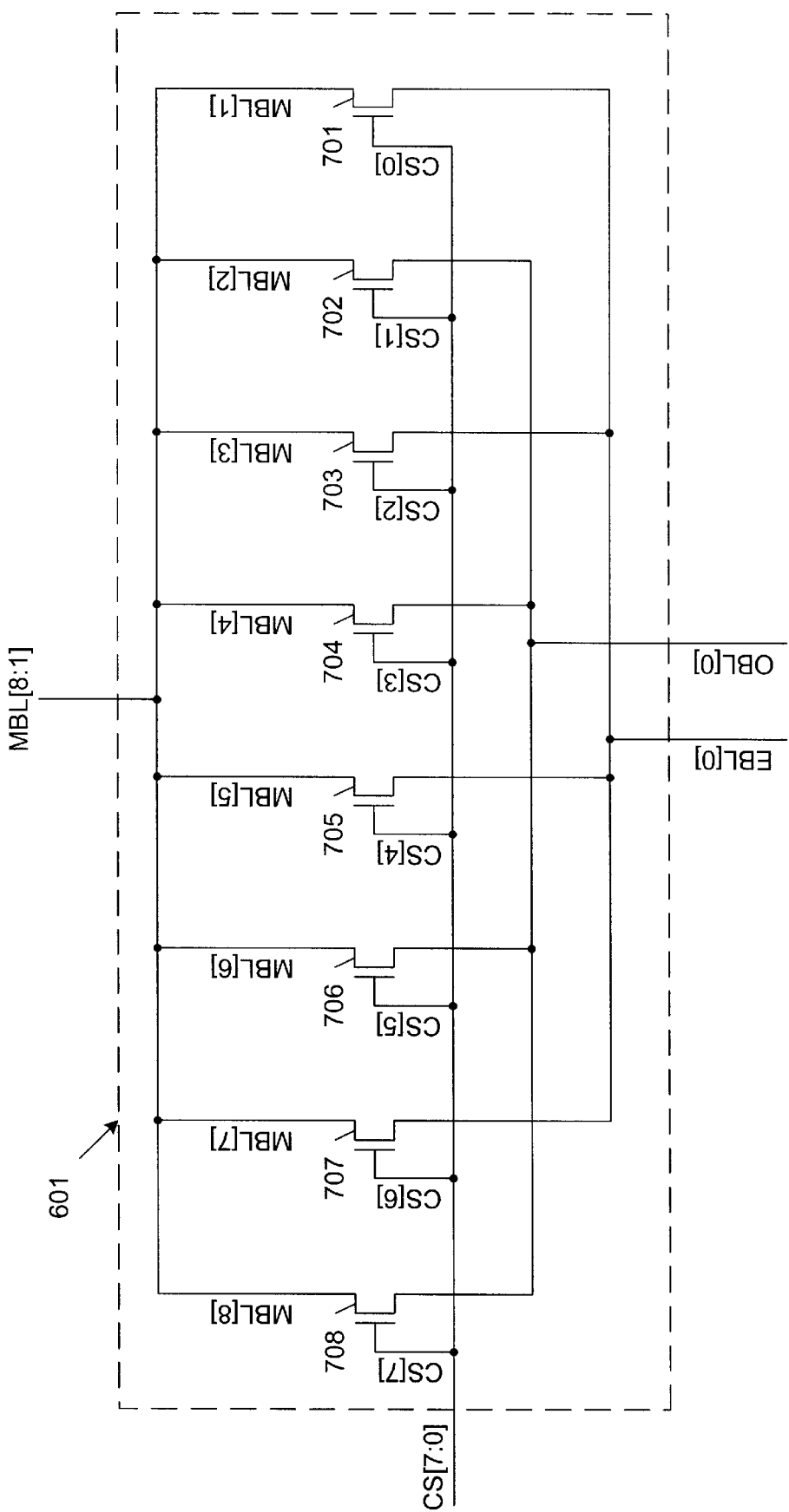
FIG. 7 is a schematic diagram of a first-level column selector circuit of the core bit line control circuit of FIG. 6 in accordance with one embodiment of the present invention.

FIG. 7 is a schematic diagram of first-level column selector circuit 601. In this embodiment, first-level column selector circuits 602–604 are identical to column selector circuit 601. Column selector circuit 601 includes n-channel pass transistors 701–708. The first power terminals of transistors 701–708 are coupled to metal bit lines MBL[1]–MBL[8], respectively. The second power terminals of transistors 701, 703, 705 and 707 are coupled to odd metal bit line OBL[0]. The second power terminals of transistors 702, 704, 706, and 708 are coupled to even metal bit line EBL[0]. Pass transistors 701–708 are controlled by column select signals CS[0]–CS[7], respectively. During read operations, the logic high level of column select signals CS[7:0] is equal to the Vcc supply voltage high enough to pass 1.5–2V. However, during program and erase operations, the logic high level of column select signals CS[7:0] is equal to about 10 Volts. Providing this 10 Volt signal enables pass transistors 701–708 to transmit relatively high program and erase voltages (e.g., 5.5 Volts and 8 Volts) to the appropriate metal bit lines.

Memory controller 405 (FIG. 4) asserts column select signals CS[7:0] such that column selector circuit 601 selects two consecutive metal bit lines (or metal bit lines MBL[8] and MBL[1]) from metal bit lines MBL[8:1]. In general, first-level column selector circuits 601–604 reduce 32 incoming metal bit lines MBL[32:1] to 8 outgoing metal bit lines OBL[3:0] and EBL[3:0]. Because each of the core bit line control circuits 502–509 includes similar first-level column selector circuits, the 256 incoming metal bit lines MBL[256:1] provided to core bit line control circuits 502–509 are reduced to 64 outgoing metal bit lines OBL[31:0] and EBL[31:0] by the first-level column selector circuits.

Returning now to FIG. 6, the metal bit lines OBL[3:0] and EBL[3:0] are provided to second-level column selector circuit 610. Column selector circuit 610 receives bit select signals BS[15:0] from memory controller 405. Column selector circuit 610 routes two of the incoming metal bit lines OBL[3:0] and EBL[3:0] as outgoing metal bit lines B[2] and B[1] in response to the bit select signals BS[15:0]. Metal bit lines B[1] and B[2] are coupled to read/program/erase voltage control circuit 620. Voltage control circuit 620 is further coupled to receive read enable signal REN#, bit line enable signal BLEN# and input data signal DIN[0] from memory controller 405, and the Vcc voltage supply from voltage regulator 420. Voltage control circuit 620 applies the appropriate voltages to metal bit lines B[1] and B[2] during read, program and erase operations. Voltage control circuit 620 also provides an output signal DOUT[0] to sense amplifier circuit 403 (FIG. 4) during read operations.

Figure 8:
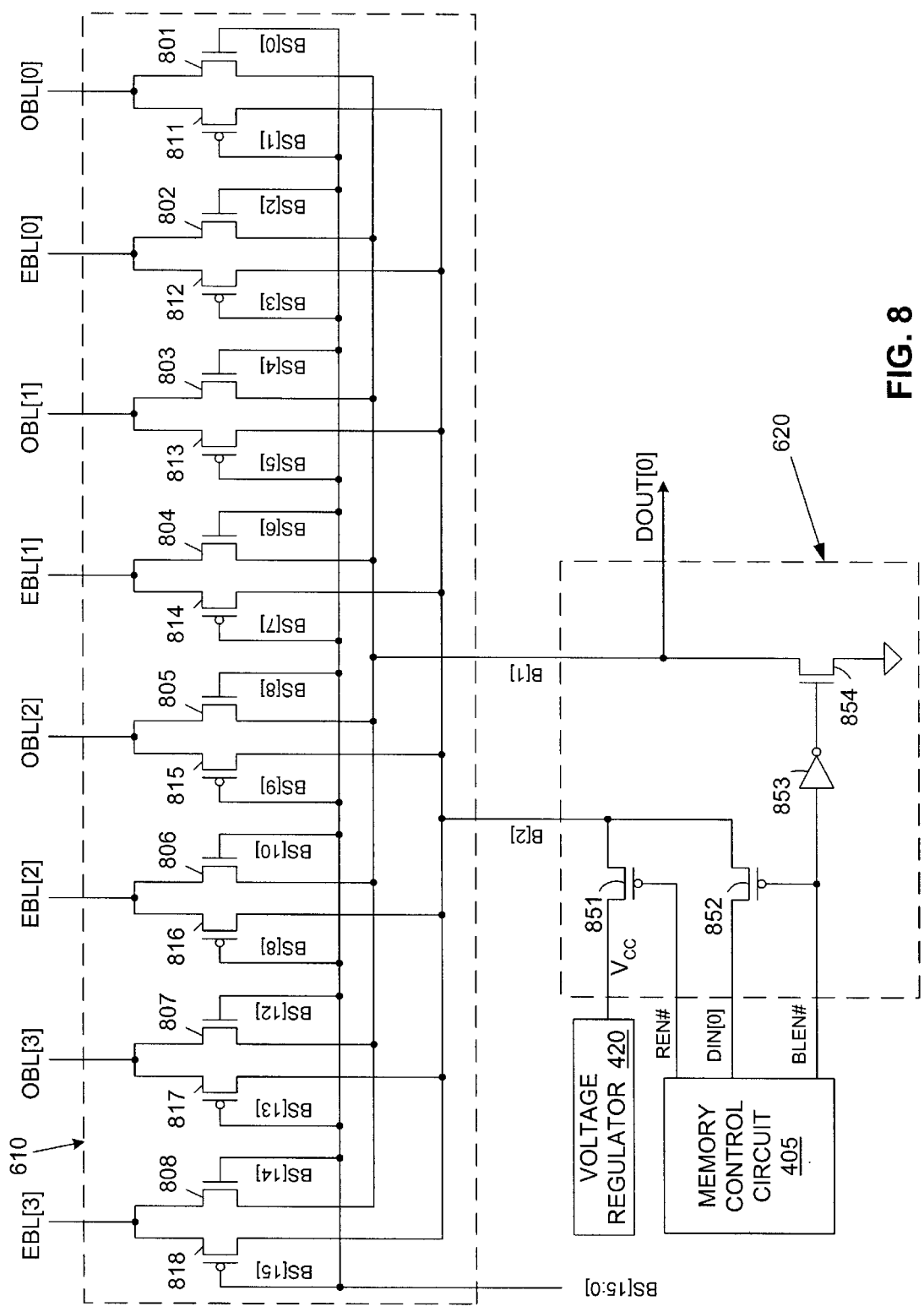
FIG. 8 is a schematic diagram of a second-level column selector circuit and a voltage control circuit of the core bit line control circuit of FIG. 6 in accordance with one embodiment of the present invention.

FIG. 8 is a schematic diagram of second-level column selector circuit 610 and voltage control circuit 620. Column selector circuit 610 includes n-channel pass transistors 801–808 and p-channel pass transistors 811–818, which are connected to metal bit lines OBL[3:0] and EBL[3:0] as illustrated. Each of transistors 801–808 and 811–818 is coupled to receive a corresponding one of the bit select signals BS[15:0]. As a result, each of the metal bit lines OBL[3:0] and EBL[3:0] can be selectively coupled to either bit line B[2] or B[1]. During read operations, the logic high level of bit select signals BS[15:0] is high enough to turn on selected p-channel transistors 811–818 (e.g., 0V) and to turn on selected n-channel transistors 801–808 to pass 1.5–2V (e.g., 2V or higher). However, during program and erase operations, the logic high level of bit select signals BS[15:0] is equal to about 10 Volts. Providing this 10 Volt signal enables n-channel pass transistors 801–808 to be turned on to transmit relatively high program and erase voltages (e.g., 5.5 Volts and 8 Volts) to the appropriate bit lines. Conversely, this 10 Volt signal enables p-channel pass transistors 811–818 to be turned off when desired. The bulk regions of the p-channel transistors in column selector circuit 610 and voltage control circuit 620 are coupled to the Vcc supply voltage during read operations and to 10 Volts during program and erase operations.

Column selector circuit 610 advantageously allows a pair of bit lines to be coupled to metal bit lines B[2] and B[1] in a first configuration and in a second configuration that is reversed from the first configuration. For example, suppose that metal bit lines MBL[2] and MBL[1] from memory block 401 (FIG. 4) are routed to column selector circuit 610 as metal bit lines EBL[0] and OBL[0], respectively. By asserting BS[0] high and asserting BS[3] low (and de-asserting BS[2, 4, 6, 8, 10, 12, 14] low and de-asserting BS[1, 5, 7, 9, 11, 13, 15] high), metal bit line MBL[2] is coupled to metal bit line B[2], and metal bit line MBL[1] is coupled to metal bit line B[1]. However, these connections can be effectively reversed by asserting BS[2] high and asserting BS[1] low (and de-asserting BS[0, 4, 6, 8, 10, 12, 14] low and de-asserting BS[3, 5, 7, 9, 11, 13, 15] high). Under these conditions, metal bit line MBL[2] is coupled to metal bit line B[1], and metal bit line MBL[1] is coupled to metal bit line B[2].

Voltage control circuit 620 includes p-channel transistors 851–852, inverter 853 and n-channel transistor 854. Voltage control circuit 620 enables the read, program and erase voltages to be applied to metal bit lines B[2] and B[1]. For example, during a read operation, memory control circuit 405 asserts the read enable signal REN# low, and de-asserts the bit line enable signal BLEN# signal high. P-channel transistor 851 is turned on to pass a read voltage from voltage regulator 420 to bit line B[2] in response to the logic low read enable signal REN#. This read voltage is equal to the $V_{cc}$ supply voltage minus the drain-to-source voltage ($V_{ds}$) of the opened p-channel transistor 851. The logic high bit line enable signal BLEN# causes inverter 853 to provide a logic low signal to the gate of n-channel transistor 854. This turns off transistor 854, thereby isolating bit line B[1] from ground. Under these conditions, metal bit line B[1] is coupled to sense amplifier circuit 403. Sense amplifier circuit 403 provide a voltage of about 0 Volts to metal bit line B[1], and then determines whether the resulting current flow is representative of a logic "0" or a logic "1" value. The voltage provided by sense amplifier circuit 403 is approximately 0.2 to 0.3 Volts. Thus, the voltage provided by sense amplifier circuit 403 approaches, but does not equal, 0 Volts. Sense amplifier circuit 403, which is a conventional circuit, stores the data value detected on bit line BL[1] as output data value DOUT[0]. Program and erase operations are performed by voltage control circuit 920 in a manner similar to that associated with the read operation, described above, and are omitted herein for brevity.

As discussed above, the ability to reverse the configuration of the metal bit lines within second-level column selector circuit 610 facilitates the read, program and erase operations to both the right and left charge trapping regions of the memory cells in memory array 401. This bi-directional current flow through each memory cell of memory array 401 requires the multiplexing circuit generated by first-level column selector circuit 601 and second-level column selector circuit 610. Accordingly, in addition to the voltage drop across p-channel transistor 851, the voltage generated by voltage regulator 420 is subjected to additional voltage drops through this multiplexing circuit. As described above, variable conditions associated with this multiplexing circuit cause the drain voltage actually passed to the memory cells to vary widely.

Figure 9:
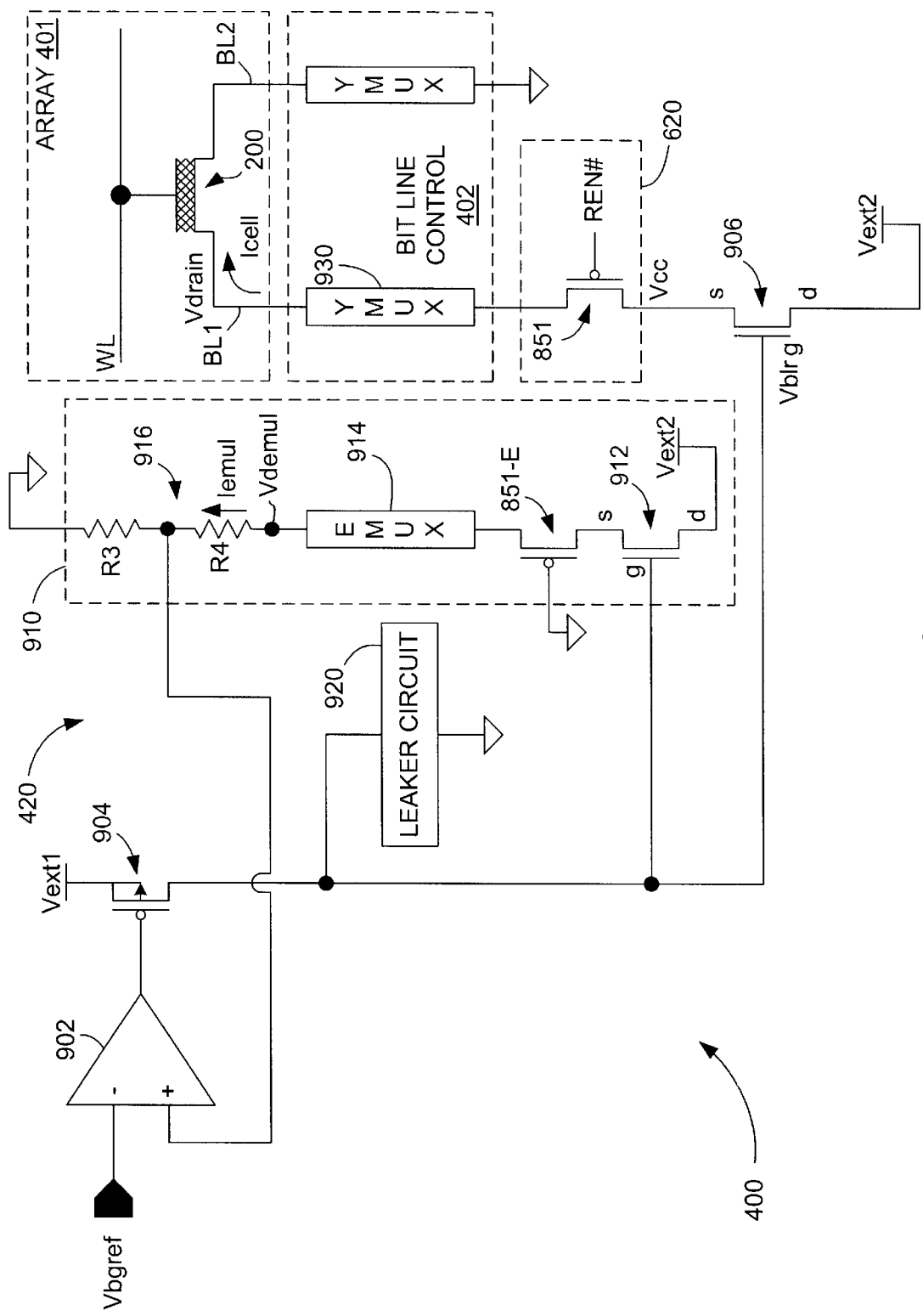
FIG. 9 is a simplified schematic diagram showing a voltage regulator according to an embodiment of the present invention.

FIG. 9 is a simplified schematic diagram showing a portion of memory device 400 including voltage regulator 420 according to an embodiment of the present invention. Voltage regulator 420 includes a differential (differential) amplifier 902, a PMOS pull-up transistor 904, a (first) clamp transistor 906, a feedback circuit (path) 910, and a leaker circuit 920. Differential amplifier has an inverting input terminal connected to receive a band gap (or other) reference voltage Vbgref, and a non-inverting input terminal connected to receive a sample voltage from feedback path 910.

Figure 1:
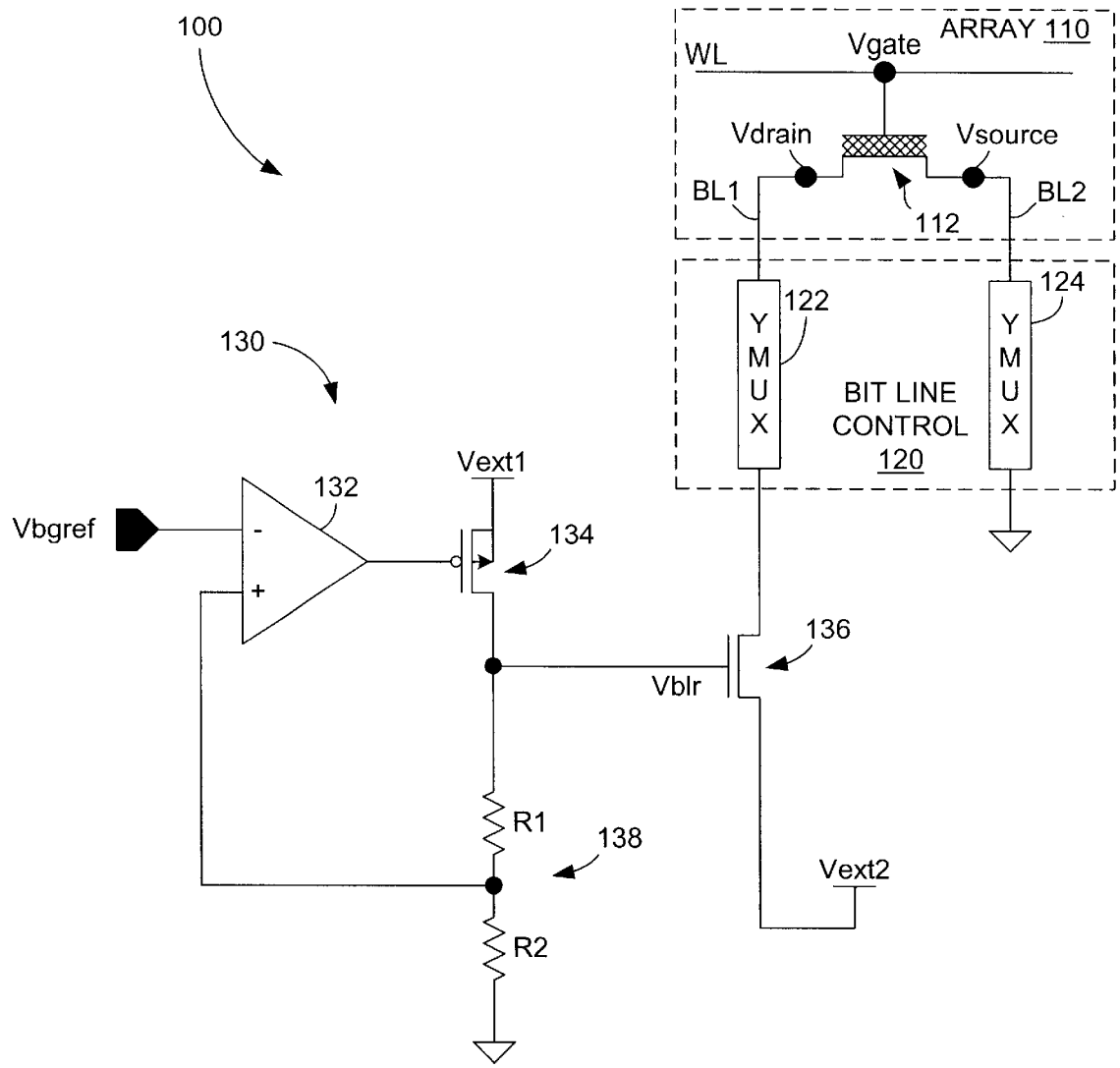
FIG. 1 is a simplified schematic diagram showing a portion of a conventional memory device.

The output terminal of differential amplifier 902 is applied to the gate terminal of PMOS transistor 904, which has a first terminal connected to a first voltage source Vext1, thereby causing PMOS transistor 904 to generate reference voltage Vblr. Reference voltage Vblr is passed from the second (lower) terminal of PMOS transistor 904 to the gate terminal of clamp transistor 906 and to feedback path 910. Accordingly, similar to conventional voltage regulator 130 (described above with reference to FIG. 1), differential amplifier 902, PMOS transistor 904, and feedback path 910 are connected to generate a reference voltage Vblr that controls the gate voltage of clamp transistor 906 in response to band gap reference voltage Vbgref. P-channel transistor 851, which is described as being part of voltage control circuit 620, is connected between clamp transistor 906 and bit line control circuit 402. Note that in some applications p-channel transistor 851 may be omitted, so that instead of clamp transistor 906 being connected to bit line control circuit 402 through p-channel transistor 851 (or some other switch), clamp transistor 906 may be directly connected to bit line control circuit 402. The term "coupled" is used herein to describe either direct or selective connection.

Reference voltage Vblr is passed from the second (lower) terminal of PMOS transistor 904 to the gate terminal of clamp transistor 906, and to feedback path 910, which feeds back a sample of Vblr to the non-inverting input terminal of differential amplifier 902. Accordingly, similar to conventional voltage regulator 130 (described above with reference to FIG. 1), differential amplifier 902, PMOS transistor 904, and feedback path 910 are connected to generate a reference voltage Vblr that controls the gate voltage of clamp transistor 906 in response to band gap reference voltage Vbgref.

Feedback path 910 includes a (second) clamp transistor 912, an emulated read enable p-channel transistor 851-E, an emulated multiplexing circuit (EMUX) 914, and a voltage divider 916. The gate terminal of clamp transistor 912 is coupled to Vblr, and EMUX 914 is connected between clamp transistor 912 and voltage divider 916. Unlike conventional voltage regulator 130, feedback path 910 compensates for resistance variations in the bit line control (multiplexing) circuit 402 by mirroring (copying) the actual path used to access the drain of selected memory cell 300. Specifically, the drain voltage Vdrain applied to the drain terminal of selected memory cell 300 is equal to second voltage supply Vext2 minus voltage drops (resistances) associated with clamp transistor 906, read enable p-channel transistor 851, and the pass transistors included in a multiplexing circuit (YMUX) 930. These voltage drops are mirrored in feedback path 910 by second clamp transistor 912, emulated read transistor 851-E, and EMUX 914. In particular, clamp transistors 906 and 912 have the same size and are fabricated at the same time, and p-channel transistor 851 and 851-E have the same size and are fabricated at the same time. Similarly, the pass transistors making up EMUX 914 have the same size and are fabricated at the same time as the transistors found in YMUX 930. Therefore, because both clamp transistors 906 and 912 are connected to Vext2 and controlled by reference voltage Vblr, and because both p-channel transistors 851 and 851-E are driven by 0 volt control signals, the drain voltage Vdrain is accurately reproduced as emulated drain voltage Vdemul at a node separating EMUX 914 and voltage divider 916 over all variable conditions.

FIG. 10 shows EMUX 914 and corresponding YMUX 930 in additional detail according to the disclosed embodiment. Note that YMUX 930 is formed by one n-channel pass transistor 702 associated with first-level column selector circuit 601, and p-channel pass transistor 812 associated with second-level column selector circuit 610 (both described above), each being turned on by an associated control signal to generate a required drain voltage Vdrain. To match the resistance introduced by pass transistors 702 and 812, EMUX 914 includes an n-channel transistor N1 that has the same size and is fabricated in the same process steps as pass transistor 702, and a p-channel transistor P1 that has the same size and is fabricated in the same process steps as pass transistor 812. Accordingly, the total resistance of emulation path 914 is essentially identical (equal) to that of YMUX 930 over all variable conditions.

Returning to FIG. 9, voltage divider 916 includes a first resistor R3 connected between the non-inverting input terminal of differential amplifier 902 and ground, and a second resistor R4 connected between the non-inverting input terminal of the differential amplifier and EMUX 914. The resistances of first resistor R3 and second resistor R4 are selected to satisfy the equation: Vdemul=Vbgref*(1+R4/R3). Further, the resistance of first resistor R3 is selected such that an emulation current Iemul through first resistor R3 is equal to the cell current Icell passing through selected memory cell 300 during a read operation. Accordingly, if Vbgref is 1.3 Volts and Vdemul is 1.8 Volts (i.e., midrange between 1.5–2 Volts), then 1+R4/R3=1.8/1.3. Therfore, R4/R3=0.5/1.3=0.385. For example, if R3=1 kohm, then R4=385 ohms.

Optional leaker circuit 920 is connected to draw a constant current through pull-up transistor 904, and is provided to assure that pull-up transistor 904 remains in saturation. Further, leaker circuit 920 aids in the elimination of overshoots during stabilization of reference voltage Vblr.

FIGS. 11(A), 11(B), and 11(C) are schematic diagrams showing leaker circuit 920 (FIG. 9) according to various embodiments. Referring to FIG. 11(A), a first leaker circuit 920-A includes a current source formed by an n-channel transistor NL that is partially turned on by a bias voltage Vbias. FIGS. 11(B) and 11(C) show alternative leaker circuits 920-B and 920-C made up of series-connected passive elements. In particular, leaker circuit 920-B includes resistors R5 and R6, and leaker circuit 920-C includes diodes D1 and D2.

Although the present invention has been described with respect to certain specific embodiments, it will be clear to those skilled in the art that the inventive features of the present invention are applicable to other embodiments as well, all of which are intended to fall within the scope of the present invention. For example, when the multiplexing circuit and read enable transistor utilized to access a selected memory cell includes only n-channel pass transistors, then the gate terminals of the emulated multiplexing circuit and emulated read transistor can be connected together to a single control voltage. FIG. 12 shows such an alternative emulated read transistor NR and alternative EMUX circuit 1214 made up of two n-channel transistors (N1 and N2) having gate terminals connected to voltage source Vext1. Further, PMOS pull-up transistor 904 can be replaced with an NMOS transistor provided the input signals to differential amplifier 902 are reversed (e.g., Vbgref is applied to the non-inverting input terminal) such that differential amplifier 902 is used as an inverting amplifier. Moreover, it is noted that the current through resistor R3 of voltage divider 916 determines the speed of the feedback in voltage regulator 420. If the current through resistor R3 is too low for stable operation of voltage regulator 420, then the current can be increased by any multiple M by increasing the resistance of each element in emulated path 914 by the multiple M. In yet another possible alternative embodiment, read transistor 851 can be coupled between PMOS pull-up transistor 904 and the gate terminals of clamp transistors 906 and 912, thereby obviating the need for emulated read transistor 851-E in the feedback path.

What is claimed is:

1. A integrated circuit device comprising:
   a memory cell;
   a first clamp transistor;
   a multiplexing circuit coupled between the first clamp transistor and the memory cell for selectively coupling the first clamp transistor to the first memory cell in response to one or more control signals, wherein the multiplexing circuit generates a first resistance when the memory cell is coupled to the first clamp transistor; and
   a voltage regulator including:
      a differential amplifier having a first input terminal connected to a reference voltage;
      a pull-up transistor having a gate terminal connected to an output terminal of the differential amplifier, a first terminal connected to a first voltage source, and a second terminal coupled to a gate terminal of the first clamp transistor; and
      a feedback path connected between the gate terminal of the clamp transistor and the second input terminal of the differential amplifier, wherein the feedback path includes an emulated multiplexing circuit having a second resistance that is equal to the first resistance of the multiplexing circuit.

2. The integrated circuit according to claim 1,
   wherein the first clamp transistor is connected between a second voltage source and the multiplexing circuit,
   wherein the feedback path further comprises a second clamp transistor connected between the second voltage source and the emulated multiplexing circuit, and
   wherein a size of the first clamp transistor is equal to a size of the second clamp transistor.

3. The integrated circuit device according to claim 2, wherein the feedback path further comprises a voltage divider having a first resistor R3 connected between the second input terminal of the differential amplifier and ground, and a second resistor R4 connected between the second input terminal of the differential amplifier and the emulated multiplexing circuit, wherein resistances of first resistor R3 and second resistor R4 satisfy the following equation:

$$Vdemul=Vbgref*(1+R4/R3),$$

where Vdemul is a voltage level at a node located between the emulated multiplexing circuit and the voltage divider, and Vbgref is the reference voltage applied to the first input terminal of the differential amplifier.

4. The integrated circuit device according to claim 3, wherein the resistances of first resistor R3 and second resistor R4 are selected such that a first current through first resistor R3 is equal to a second current passing through the memory cell during a read operation.

5. The integrated circuit device according to claim 1, further comprising a leaker circuit connected between the second terminal of the pull-up transistor and ground.

6. The integrated circuit device according to claim 5, wherein the leaker circuit comprises a current source.

7. The integrated circuit device according to claim 5, wherein the leaker circuit comprises one or series-connected passive circuit elements.

8. The integrated circuit device according to claim 1, wherein the multiplexing circuit includes a plurality of first pass transistors connected in series, and the emulated multiplexing circuit includes a plurality of second pass transistors connected in series, wherein a number of first pass transistors connected in series between the first clamp transistor and the memory cell is equal to a number of second pass transistor connected in series in the emulated multiplexing circuit.

9. The integrated circuit device according to claim 8, wherein a first voltage applied to gate terminal of first pass transistors is equal to a second voltage applied to gate terminal of second pass transistors.

10. The integrated circuit device according to claim 8, wherein the second pass transistors includes a first NMOS transistor and a second NMOS transistor, wherein a gate terminal of first NMOS transistor is connected to a gate terminal of second NMOS transistor.

11. The integrated circuit device according to claim 1, wherein the memory cell comprises a 2-bit non-volatile memory cell including a nitride layer sandwiched between two oxide layers.

12. A integrated circuit device comprising:
a memory cell;
a first clamp transistor;
a multiplexing circuit including a first transistor and a second transistor connected in series and coupled between the first clamp transistor and the memory cell, the first and second transistors being selectively turned on to couple the first clamp transistor to the first memory cell in response to corresponding first and second control signals, wherein the first and second transistors respectively generate a first resistance and a second resistance when the memory cell is coupled to the first clamp transistor; and
a voltage regulator including:
a differential amplifier having a first input terminal connected to a reference voltage;
a pull-up transistor having a gate terminal connected to an output terminal of the differential amplifier, a first terminal connected to a first voltage source, and a second terminal coupled to a gate terminal of the first clamp transistor; and
a feedback path connected between the gate terminal of the first clamp transistor and the second input terminal of the differential amplifier,
wherein the feedback path includes an emulated multiplexing circuit having a third transistor and a fourth transistor connected in series, wherein a resistance of the third transistor is equal to the first resistance of the first transistor multipled by an integer M, and wherein a resistance of the fourth transistor is equal to the second resistance of the second transistor multipled by the integer M.

13. The integrated circuit according to claim 12,
wherein the first clamp transistor is connected between a second voltage source and the multiplexing circuit,
wherein the feedback path further comprises a second clamp transistor connected between the second voltage source and the emulated multiplexing circuit, and having a gate terminal connected to the gate terminal of the first clamp transistor, and wherein a size of the first clamp transistor is equal to a size of the second clamp transistor.

14. The integrated circuit device according to claim 12, wherein the feedback path further comprises a voltage divider having a first resistor R3 connected between the second input terminal of the differential amplifier and a third voltage source, and a second resistor R4 connected between the second input terminal of the differential amplifier and the emulated multiplexing circuit, wherein resistances of first resistor R3 and second resistor R4 satisfy the following equation:

$$Vdemul=Vbgref*(1+R4/R3),$$

where Vdemul is a voltage level at a node located between the emulated multiplexing circuit and the voltage divider, and Vbgref is the reference voltage applied to the first input terminal of the differential amplifier.

15. The integrated circuit device according to claim 14, wherein the resistances of first resistor R3 and second resistor R4 are selected such that a first current through first resistor R3 is equal to a second current passing through the memory cell during a read operation.

16. The integrated circuit device according to claim 12, further comprising a leaker circuit connected between the second terminal of the pull-up transistor and ground.

17. The integrated circuit device according to claim 16, wherein the leaker circuit comprises a current source.

18. The integrated circuit device according to claim 16, wherein the leaker circuit comprises one or series-connected passive circuit elements.

19. The integrated circuit device according to claim 12, wherein the memory cell comprises a 2-bit non-volatile memory cell including a nitride layer sandwiched between two oxide layers.

20. A voltage regulator for generating an actual voltage at a node in an integrated circuit device, the voltage regulator transmitting an intermediate voltage that is passed through a multiplexing circuit formed by first pass transistors having first resistances determined by variable conditions, wherein the first pass transistors include a first clamp transistor, and wherein the voltage regulator comprises:
a differential amplifier having a first input terminal connected to a reference voltage;
a pull-up transistor having a gate terminal connected to an output terminal of the differential amplifier, a first terminal connected to a first voltage source, and a second terminal coupled to a gate terminal of the first clamp transistor; and
a feedback path including an emulated multiplexing circuit connected to a voltage divider,
wherein the emulated multiplexing circuit includes second pass transistor having second resistances that are equal to the first resistances of the first pass transistors such that an emulated voltage passed from the emulated multiplexing circuit is equal to the actual voltage passed by the multiplexing circuit to the node, and
wherein the voltage divider provides sampling of the emulated voltage to the second input terminal of the differential amplifier.

* * * * *